United States Patent [19]
Del Bianco et al.

[11] 4,338,152
[45] Jul. 6, 1982

[54] GRIPPING ARRANGEMENT FOR AN APPARATUS FOR AUTOMATICALLY LAMINATING CIRCUIT BOARDS

[75] Inventors: Matthew A. Del Bianco, Chesapeake Isle, North East, Md.; Henry J. Tancredi, Gwynedd, Pa.

[73] Assignee: E. I. Du Pont de Nemours and Company, Wilmington, Del.

[21] Appl. No.: 235,414

[22] Filed: Feb. 17, 1981

[51] Int. Cl.³ .............................................. B31B 1/00
[52] U.S. Cl. ................................... 156/351; 156/361; 156/522; 156/552; 225/101; 226/162
[58] Field of Search ........ 156/522, 552, 544, 361–364, 156/250, 510, 351; 225/100, 101, 105, 96.5; 226/162

[56] References Cited

U.S. PATENT DOCUMENTS

| | | | |
|---|---|---|---|
| 3,674,590 | 7/1972 | Holman | 156/522 |
| 4,025,380 | 5/1977 | Bernardo | 156/522 X |
| 4,214,936 | 7/1980 | Del Bianco | 156/361 X |
| 4,217,163 | 8/1980 | Utymann et al. | 156/361 |
| 4,284,221 | 8/1981 | Nagel et al. | 225/100 X |

Primary Examiner—David A. Simmons

[57] ABSTRACT

A gripping arrangement for removing laminated circuit boards from the lamination region of an automatic laminating apparatus includes a gripping element which grasps the board after a predetermined portion has emerged from the apparatus. A carriage is simultaneously actuated to impose a displacement force on the laminate to assist in withdrawing it from the apparatus.

2 Claims, 8 Drawing Figures

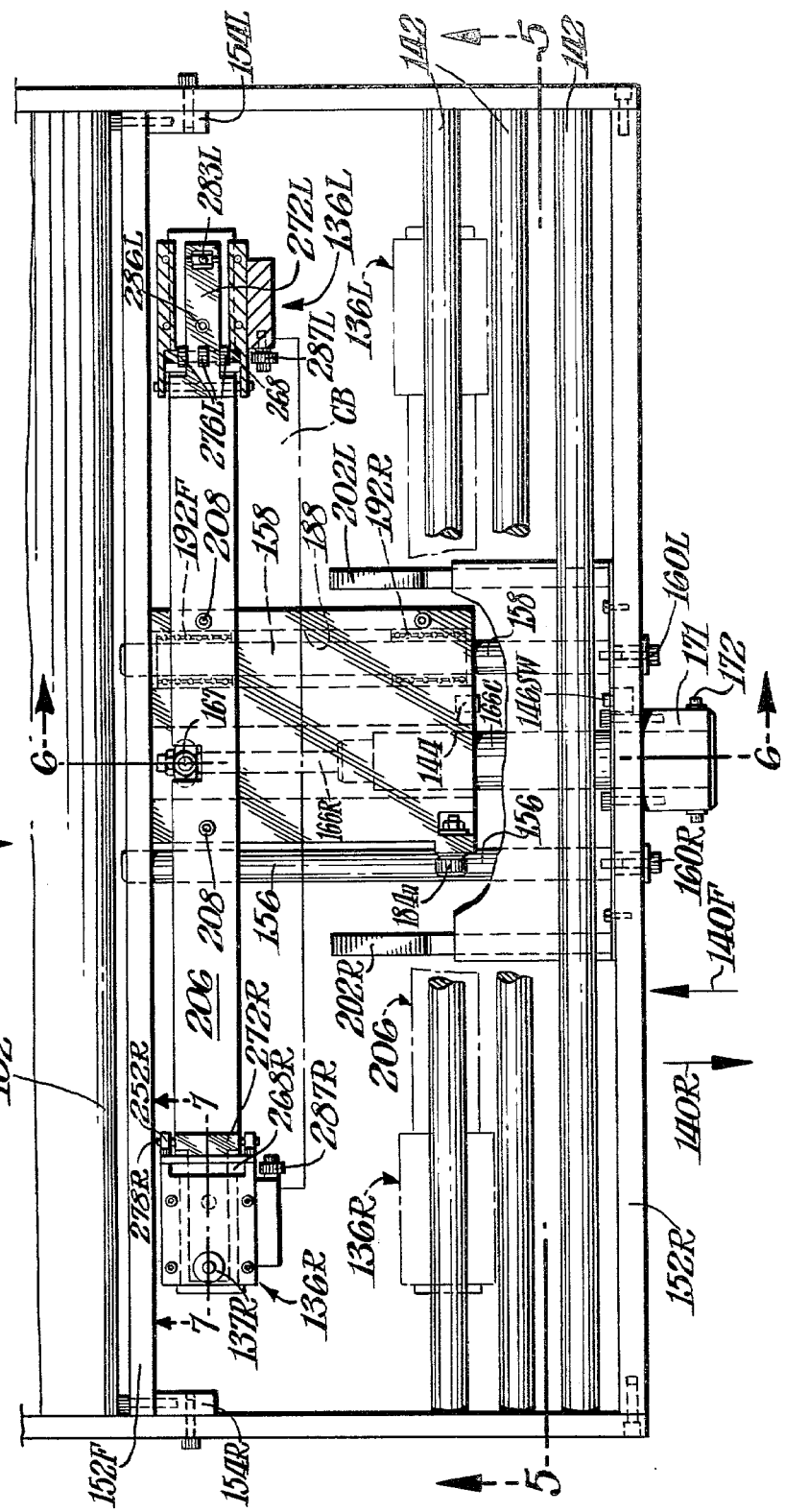

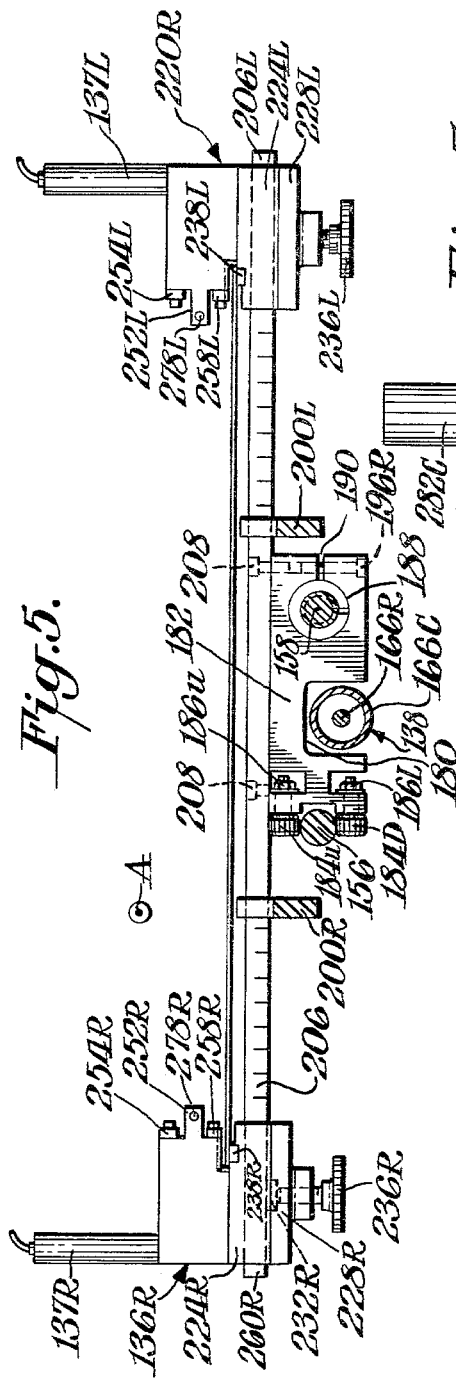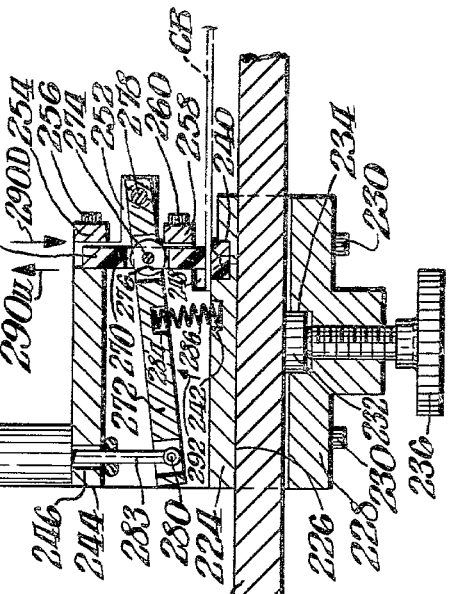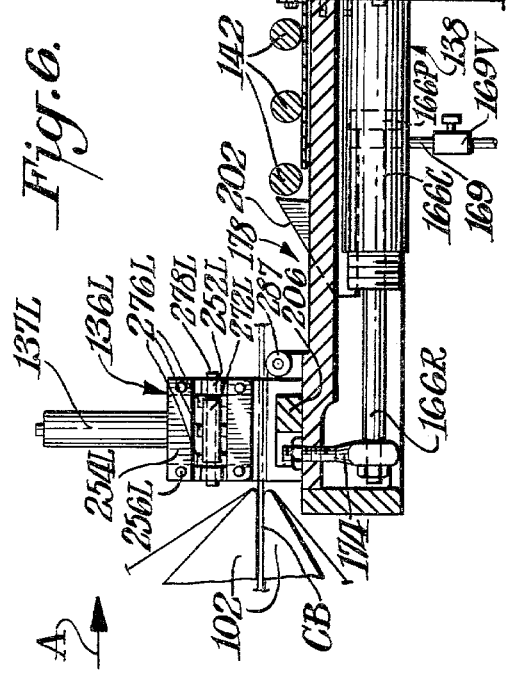

GRIPPING ARRANGEMENT FOR AN APPARATUS FOR AUTOMATICALLY LAMINATING CIRCUIT BOARDS

FIELD OF THE INVENTION

This invention relates to a gripping arrangement for removing laminated boards from automatic laminating apparatus.

BACKGROUND OF THE INVENTION

When using a dry film photopolymer resist material, such as that manufactured by E. I. du Pont de Nemours and Company, Inc. and sold under the trademark RISTON ®, it is necessary to laminate a layer of that material onto the surface of a circuit board or other substrate prefatory to exposure by actinic radiation. Typically, the layer of photopolymer resist material is laid over the surface of the substrate to be covered and the substrate and resist passed between the nip of heated laminating rolls. The surface of the substrate may be previously scrubbed to remove oxide layers and other contaminants therefrom. The scrubbing assists in the adhesion of the resist material to the substrate. If done manually, the preparation of the substrate and the introduction and removal thereof into and from the laminating rolls is time consuming and expensive.

It is advantageous to increase the throughput of the laminating operation by providing an apparatus adapted to automatically prepare the surface of the substrate, convey the prepared substrate to the lamination region which contains the heated laminating rolls, and thereafter remove laminated boards from the apparatus for further fabrication. However, in any automated apparatus certain minimum requirements are believed necessary in order to most efficiently and effectively laminate a resist layer to the surface of a substrate.

For example, if copper coated boards are to be laminated with a resist material, it is believed to be advantageous to utilize a conveyance arrangement which expeditiously translates the board from the region in which the surface thereof is scrubbed to the region in which the board is laminated in order to minimize the oxidation of the surface of the substrate to the fullest extent possible.

To avoid wastage of resist material, it is also desirable that individual boards be presented to the laminating rolls with as little a gap as possible between a given board and a trailing board. Thus, any conveyance arrangement should be adapted to avoid cumulative gapping between successive boards introduced into the lamination region. It is believed to be most desirable to provide a conveyance arrangement wherein successive boards are in an abutted relationship (tail-to-head) at the time one of the boards is introduced into the laminating rolls. Moreover, any conveyance arrangement should be able to maintain abutment between successive boards without regard to variations in board length from run to run. Since the boards being laminated are relatively thin planar members, it is also necessary that any conveyance arrangement be adapted to prevent board overlap. That is, the leading edge of a trailing board must not extend over or under the trailing edge of a leading board. Such an occurrence can potentially render inutile both boards.

In the lamination region itself, it is believed desirable to provide a mechanism whereby the laminating rolls are accurately brought into contact with the leading edge of a leading board in a run and (assuming the boards are butted) removed from contact as the trailing edge of the last trailing board exits the laminating rolls. Such a practice is advantageous in that it avoids wastage of resist material. Moreover, the laminating rolls should be susceptible to accurate opening and closing motions which would bring the rollers into contact with the surfaces of the board and predictably impart a predetermined pressure force to the board to laminate the resist layer thereto. The gap, or nip, formed between the rollers when the rollers are closed should, moreover, be predictably adjustable.

Once the board and resist material have been laminated, the laminate (i.e., substrate and resist layer adhered thereto) so formed should be automatically removable from the apparatus. With those resist materials which are provided with a backing strip the laminate may be moved through the apparatus incidentally to the take-up of the backing strip. When the backing strip is being taken-up, care must be exercised that proper tension is maintained on the strip. It is therefore believed advantageous to provide a slip clutch tension device to insure that the take-up tension force exerted by a take-up roller on the backing strip be held within appropriate limits.

While any portion of the laminate is still within the apparatus the laminate is subjected to a restraining force which tends to resist any displacing force imposed on the laminate to assist in its withdrawal from the apparatus. However, when laminate is drawn through the automated apparatus it is desirable to provide a structural arrangement whereby the laminate is separated from the backing strip and any unadhered resist present between the trailing edge of the laminate and the leading edge of the next-successive laminate. Accordingly, it is believed advantageous to provide a gripping arrangement adapted to grasp the laminate when a predetermined portion thereof has exited from the apparatus and to exert a force on the laminate which pulls it free from the trailing resist material when the backing strip is completely removed from the laminate.

SUMMARY OF THE INVENTION

The instant invention relates to a gripping arrangement for removing a laminated circuit board from an apparatus for automatically laminating the board with a resist material, the laminated board being subjected to a restraining force while within the apparatus.

The gripping arrangement includes a carriage reciprocally movable under the influence of a predetermined displacement force from a first to a second position. An actuator is associated with the carriage for applying the displacement force thereto. The carriage carries a gripping element having a grasping member movable by a second actuator from an open to a grasping position. A detector is arranged in proximity to the apparatus for generating a signal representative of the emergence of the laminate from the apparatus. Control means responsive to the signal simultaneously energize the actuators to move the grasping member to the grasping position to grasp the laminated board and to initiate the application of the displacement force to the carriage. The magnitude of the displacement force is such that the displacement force is dominated by the restraining force until the laminate is advanced completely through the apparatus, the displacement force thereupon becoming dominant to free the laminate from the resist material and displace the carriage to the second position.

BRIEF DESCRIPTION OF THE DRAWINGS

The invention will be more fully understood from the following detailed description thereof, taken in connection with the accompanying drawings, which form a part of this application and in which:

FIGS. 4, 5, and 6 are, respectively, a plan view, an end view and a side section view of an apparatus for gripping and removing circuit boards in accordance with the instant invention; and FIG. 7 is a sectional view of an individual gripping element taken along section lines 7—7 of FIG. 4.

DETAILED DESCRIPTION OF THE INVENTION

Figure 1:
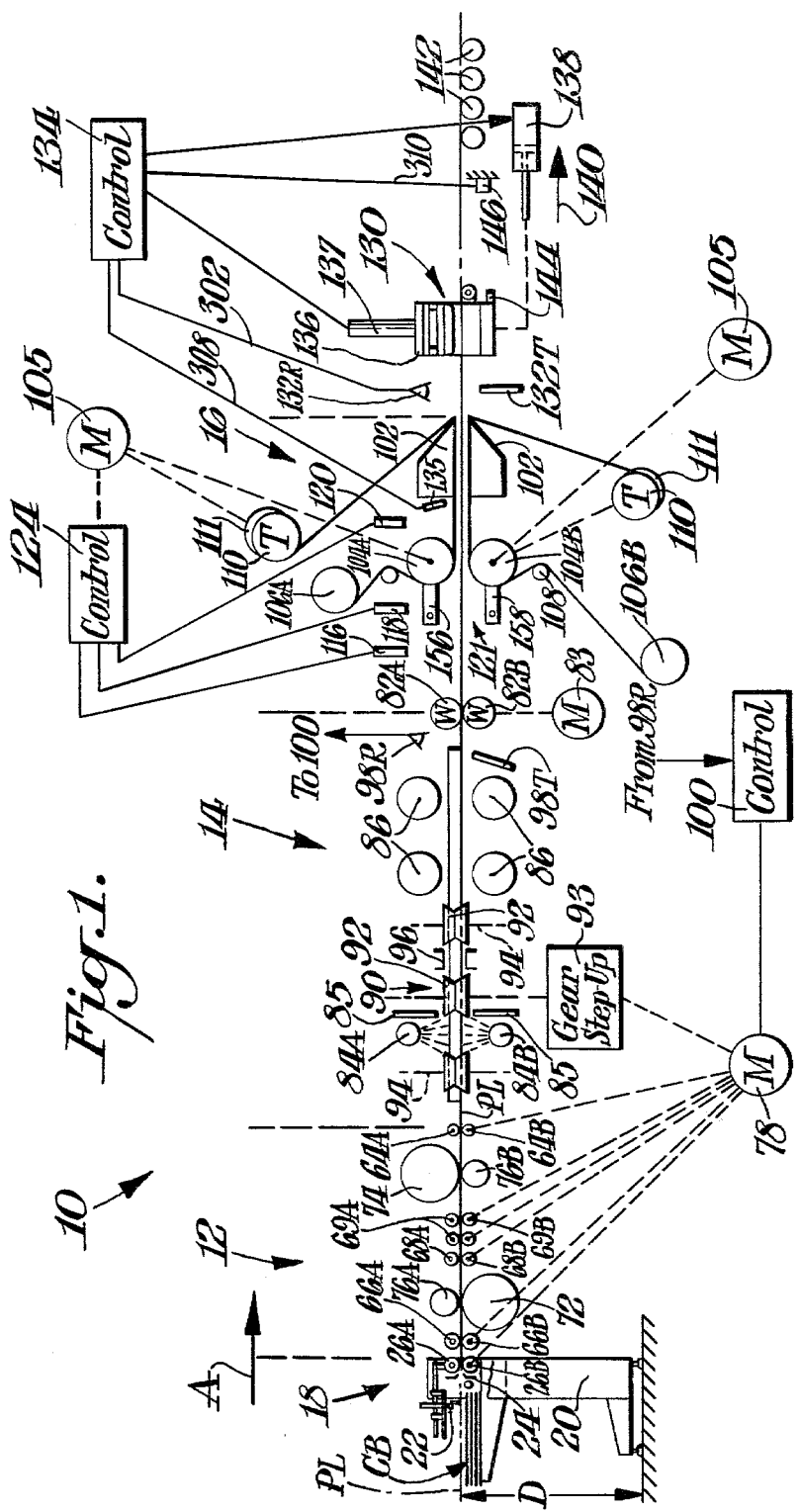
FIG. 1 is a stylized schematic representation of an apparatus for automatically laminating a circuit board with which the instant invention is utilized.

Throughout the following detailed description similar reference numerals refer to similar elements in all Figures of the drawings.

FIG. 1 is a highly stylized schematic representation of an apparatus 10 for automatically laminating individual circuit boards CB with a dry film photopolymer resist material such as that sold by E. I. du Pont de Nemours and Company, Inc. under the trademark RISTON ®. The individual circuit boards CB able to be handled by the apparatus 10 in accordance with this invention are typically planar members having planar width dimensions ranging from twelve to eighteen inches and planar length dimensions ranging from fourteen to twenty-four inches. Individual circuit boards CB may have a thickness dimension in a range from 0.030 inches to 0.125 inches. The boards CB form the substrate upon which a layer of the resist material may be laminated to the upper surface, the lower surface or both surfaces of the board CB. The boards CB may be fabricated of a single copper plate or may themselves be laminates of several intermediate plates (commonly called "inner layers") with the upper and lower surfaces of the boards CB being copper.

The apparatus 10 is an integrated device which is able to perform each of the functions necessary to prepare an individual circuit board CB for the application of a dry film photopolymer resist material and to apply the resist material thereto. The apparatus 10 includes a brush cleaning region 12 (hereafter the "cleaning section"), a rinse and air-dry region 14 (hereafter the "rinsing section"), and a lamination region 16 (hereafter the "laminating section"). Individual circuit boards CB are introduced into the cleaning section 12 of the apparatus 10 by an in-feed arrangement 18.

The in-feed arrangement 18 includes a frame 20 having a pneumatic carrying element 22 mounted thereon. Individual circuit boards CB are lifted from a supply of boards and carried by the carrying element 22 to a lead-in guide 24 terminating at the nip of an inlet pair of nip rollers 26 disposed at the inlet of the cleaning section 12.

Figure 2:
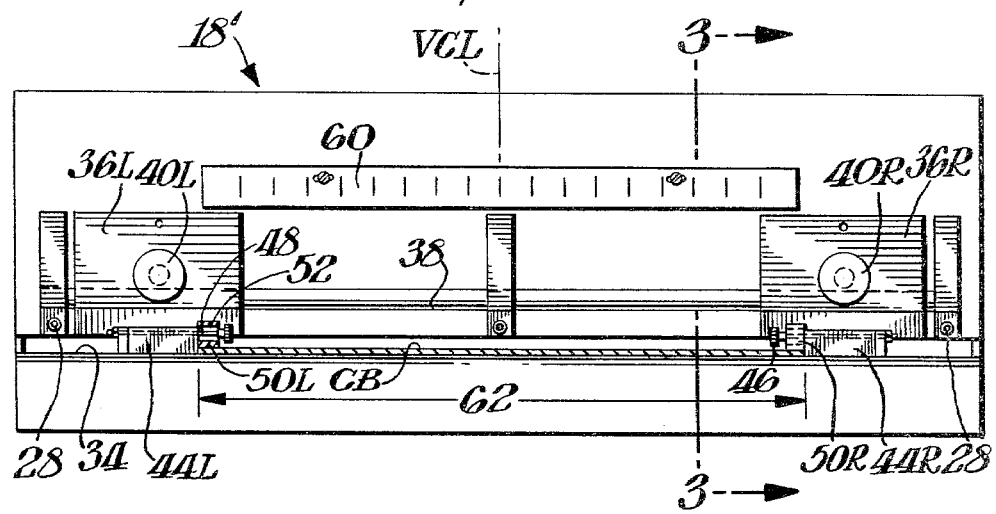
FIGS. 2 and 3 are, respectively, a front elevation view and a side section view of an alternate in-feed arrangement.
Figure 3:
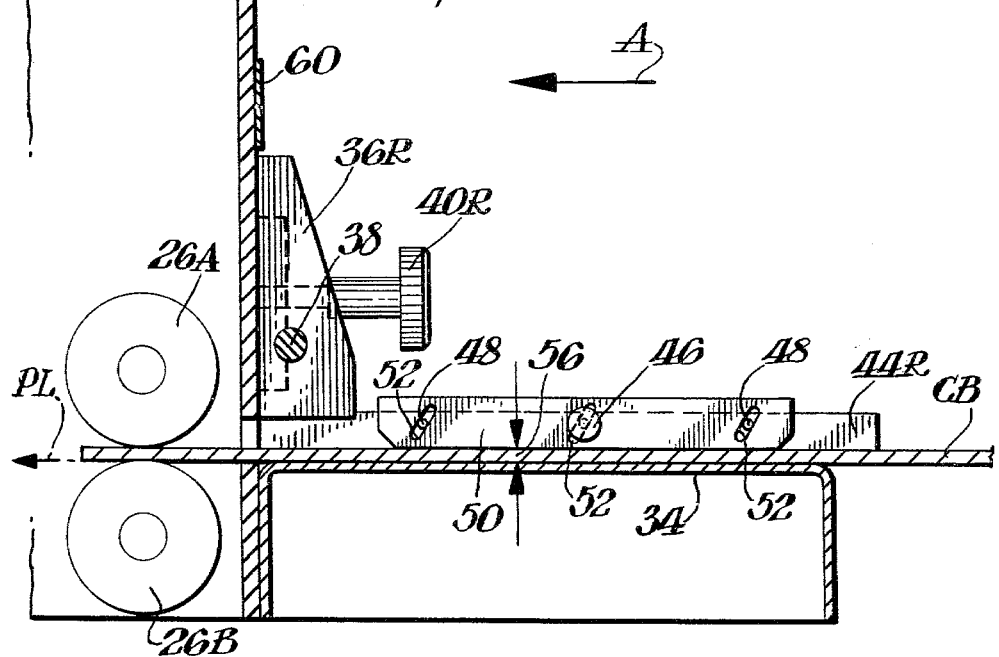

Alternatively, individual circuit boards CB may be manually fed into the apparatus 10 through an in-feed arrangement 18' shown in FIGS. 2 and 3. The in-feed arrangement 18' is attachable to the front of the apparatus 10 by any suitable means, as by screws 28. The in-feed arrangement 18' includes a planar tray 34 having laterally adjustable guides 36L and 36R movably disposed along a fixed guide shaft 38. The guides 36 are supportable in a fixed location along the shaft 38 by lock nuts 40. Each guide 36 includes a forwardly projecting arm 44 having a lug 46 and guide pins 48 extending therefrom in a confrontational relationship with the lug 46 and the pins 48 on the opposite arm 44. A runner 50 having inclined slots 52 therein is received on the lug 48 and guide pins 50 extending from each of the arms 44. The runners 50 slide in the slots 52 with respect to the lug 46 and pins 48 to increase or decrease the vertical dimension 56 of an in-feed slot defined between the lower surface of the runners 50 and the upper surface of the planar tray 34. By limiting the vertical dimension 56 of the in-feed slot it is possible for an operator to insert only a single board CB into the apparatus 10 at any given time. Because of the thickness limitation of the in-feed slot, circuit boards CB may only be serially introduced into the inlet nip rollers 26 of the apparatus 10, thus preventing overlap of boards.

The spacing 62 defined between the confronting portions of the arms 44 serves to channelize the circuit boards CB into a path of travel symmetrical about the vertical centerline VCL extending through the apparatus 10. The transverse dimension of the spacing 62 between the arms 44 is indicated by an indicia 60. The transverse dimension of the path of travel is adjustable to correspond to the planar width dimension of the boards CB being laminated. The individual circuit boards CB are conveyed through the apparatus 10 along a pass line PL (FIG. 1). The pass line PL is an imaginary horizontal line extending from the inlet to the outlet of the apparatus along which the lower surface of a board CB is conveyed as the board moves through the various regions of the apparatus. The pass line PL may be defined as a line extending through the apparatus 10 that lies a predetermined fixed distance D from a predetermined reference datum, as the floor of the workspace on which the apparatus is disposed. Hereafter, the pass line PL shall serve as a vertical reference datum for locating structural elements within the apparatus 10 as being either thereabove or therebelow. The vertical centerline VCL through the apparatus 10 shall serve a horizontal reference datum for locating structural elements as being either right or left as viewed from the in-feed end of the apparatus 10 (FIG. 2). Circuit boards CB are conveyed along the pass line PL in a path of travel in the direction of arrow A (FIG. 1) extending from the in-feed end of the apparatus, through the cleaning section 12, the rinsing section 14, to the outlet of the laminating section 16.

The cleaning section 12 is defined between the inlet pair of nip rollers 26A and 26B (respectively above and below the pass line PL) and a second, outlet, pair of nip rollers 64A and 64B. Intermediate pairs of nip rollers 66A and 66B, 68A and 68B and 69A and 69B are disposed within the cleaning section 12 and cooperate with the rollers 26 and 64 to define a conveyor by which circuit boards CB are transported through the cleaning section 12 along the pass line PL. Intermediate between the nip rollers 66 and 68 is a lower surface brush scrubber 72 while an upper surface brush scrubber 74 is disposed between the nip rollers 64 and 69. The brush scrubber 72 is located below the pass line PL while the brush scrubber 74 is disposed above the pass line PL. Each scrubber acts against an associated backup roller 76A and 76B, respectively. The nip rollers 26, 64, 66, 68 and 69 are driven by a drive motor 78 appropriately geared such that circuit boards CB are passed through the cleaning section 12 at a first predetermined linear speed (typically eight linear feet per minute). It is at this speed that boards CB exiting the cleaning section 12 enter the adjacent rinsing section 14 through the nip rollers 64A and 64B. In the cleaning section 12 the abrasive action of the nylon bristle brushes with silica carbide inserts on the scrubbers 72 and 74 respectively remove oxide and a thin layer of material from both the lower and upper surfaces of the board CB. The scrubbers 72 and 74 are rotated by a drive motor (not shown) and are also movable with respect to the vertical center line VCL of the apparatus 10. This transverse motion of the brush scrubbers assists their removal of the thin layer of material from the surface of the circuit board CB. Suitable for use as the cleaning section 12 is a Surface Finisher sold by Chemcut, Inc. of State College, Pa. under Model No. 107. Of course any other suitable surface cleaner may be utilized.

Between the pair of nip rollers 64 at the exit of the cleaning section 12 and a pair of wetting rolls 82 lies the rinsing section 14. In this section the now-scrubbed surfaces of the circuit boards CB are rinsed by the application of a water spray from nozzles 84A and 84B arranged above and below the pass line PL, respectively. Suitable baffles 85 are provided to prevent water from leaving the portion of the rinsing section in the vicinity of the nozzles 84. The boards CB are air dried by streams of air directed theretoward from an array 86 of air knives. The rinsing and air-dry procedure removes copper fines and other extraneous matter from the scrubbed surfaces of the boards preparatory to the introduction of the boards to the laminating section 16.

The wetting rolls 82 contain an inner core formed of a hollow stainless steel rod having radially extending slots therethrough. Wetting solution is introduced to the interior of the core through rotary unions which also act as trunnions to support the wetting rolls 82 in the frame of the apparatus 10. Disposed around the exterior of the core is an outer layer of porous polyethylene. This layer is covered by a fabric sock outer covering. The polyethylene layer and outer fabric sock meter the wetting solution onto the surface of the boards. The wetting rolls 82 are connected to a drive motor 83 and are preferably driven at the same linear speed as nip rollers 64.

The boards CB are conveyed through the rinsing section 14 by a conveyance arrangement including a V-roller drive 90. The V-roller drive includes an array of roller elements 92 which rotate on axes 94 perpendicular to the pass line PL. The rollers 92 have a peripheral slot therein which receives the lateral edges of each board CB and guides the edges of the boards CB into contact with a driving surface disposed at the base of the slot. The driving surface defines a predetermined friction angle with the axis 94 of the roller. The rollers 92 drive each circuit board CB from the nips 64 to the wetting rolls 82. The V-roller drive 90 translates an otherwise unrestrained board CB at a speed greater than the linear speed at which the board is driven while under the influence of either the nip rollers 64 or the wetting rolls 82. However, whenever a board is restrained (by either the nip rollers 64 or otherwise) the same friction angle allows the rollers 92 to slip against the edge of the board. The V-rollers 92 in the V-roller drive are driven by a geared interconnection 93 with the motor drive 78 at a velocity greater than the velocity at which the nip rollers 64 are driven.

The V-roller drive 90 translates boards from the exit of the nip rollers 64 into abutting relationship with the trailing edge of a preceding board already engaged in the wetting rolls 82. Board overlap is prevented by the vertical dimension of the peripheral slot in the rollers 92 and by horizontally disposed plates 96 arranged to form slots which register with the slots in the rollers 92. The slots in the rollers 92 and those formed by the plates 96 (which engage the edges of the boards in the regions between V-rollers 92) prevent the occurrence of board overlap. A detector arrangement 98 is located upstream of the wetting rolls 82 to detect gaps between boards entering the wetting rolls 82. A gap (or nonabutting relationship) between boards is detected by the detector 98 and a signal generated thereby is applied to a motor control network 100 which results in an increased speed of rotation of the V-rollers 92 and also an increased speed of boards through the cleaning section 12. As a further result of the increase of board speed, there is an increase in the rate at which circuit boards CB are fed by the in-feed arrangement 18 (or an operator if the manual in-feed 18' is used) to the apparatus 10.

Still with reference to FIG. 1 the laminating section 16 is disposed between the wetting rolls 82 and the nose of wedges 102. In the laminating section 16 the upper and lower surfaces of the circuit board CB are provided with a layer of dry film photopolymer resist through the action of a pair of laminating rolls 104A and 104B. The laminating rolls 104 are driven by a motor 105.

A supply of photopolymer resist material for the upper and lower surfaces of the circuit boards is respectively stored on supply rolls 106A and 106B. The photopolymer resist material includes a web or film of the resist material itself supported on a substrate or backup strip of any suitable material. From the supply rolls 106 the resist material is trained over guide rolls 108 and into the gap between the laminating rolls 104. It is between the laminating rolls 104 that the film resist is adhered by the application of heat and pressure to the surface of the circuit board. The backup strip, now forming the outer layers of a sandwich which includes a laminate (formed of the circuit board and the resist material adhered thereto) extends through the apparatus 10 to and through the wedges 102. At the nose of the wedges 102 the backup strip diverges sharply and is peeled away from the resist material, leaving the laminated sandwich of the board having upper and lower layers of photopolymer resist material thereon.

The backup strip is taken-up by a take-up rolls 110 each having a continuously slipping clutch tension device 111 associated therewith. The drive sprockets for the laminating rolls 104 and for the take-up rolls 110 are driven by the same motor 105. Due to a difference in the size of the drive sprockets, the speed of the drive sprocket for the take-up rolls 110 is greater than the speed of the drive sprocket for the laminating rolls 104. However, due to the provision of the continuously slipping clutch tensioning device 111, the mandrel of each of the take-up rolls is rotated at a lesser angular speed, thus controlling the tension force applied to the backup strip by the rolls 110.

An array of sensors 116, 118, and 120 are disposed at predetermined locations in the laminating section 16. Each sensor 98, 116, 118 and 120 comprise a pair including a phototransmitter T and a photoreceiver R. The first sensor 116 is arranged to generate a signal to a control arrangement 124 when the leading edge of the first circuit board in the train of boards passing the sensor 116. This signal initiates operation of the drive motor 105 which drives the laminating rolls 104 and the take-up rolls 110. A signal from the second sensor 118 that the leading end of the first circuit board is moving therepast initiates the closing of the laminating rolls 104. The laminating rolls 104 close just as the leading edge of the first board enters the nip thereof. When the trailing edge of the last board passes the sensor 120 a signal is generated thereby representative of that fact and the laminating rolls 104 are opened. For clarity of illustration, only the photoreceivers R for the sensors 116, 118 and 120 are shown in FIG. 1.

A crank diagrammatically indicated at 121 facilitates the opening and closing of the laminating rolls 104.

As noted earlier the now-laminated circuit board (or "laminate") is advanced through the laminating section 16 downstream of the laminating rolls by the action of the take-up rolls 110. The take-up action of the rolls 110 draws the laminate through the pair of wedges 102 and at the wedges the backup strip diverges sharply toward the take-up rolls 110 and is thereby removed from the surface of the film which has been heat-laminated into the board. While any portion of the laminate is still within the apparatus the laminate is subjected to a restraining force which tends to resist any displacement force imposed on the laminate in the direction of arrow A. However, the laminate need be separated from the backing strip and any unadhered resist material present between the trailing edge of the laminate and the leading edge of the next-successive laminate.

As the laminate begins to emerge from the nose of the wedges 102 a detector 132 generates a signal to a control network 134 over a line 302. Suitable for use as the phototransmitter T for the sensor pair 132 (and for each of the other pairs 98, 116, 118 and 120) is a device manufactured by Banner Engineering Corp., Minneapolis, Minn. and sold under model number LR400. The photoreceiver R for the pair 132 (and for all other pairs) is a device sold by the same manufacturer under model number PT400. These devices are used with a modulating amplifier MB3-4 sold by the same manufacturer. In practice the phototransmitter T is mounted below the pass line PL facing upwardly, while the receiver R is mounted above the pass line PL facing downwardly. The speed at which the laminate leaves the wedges 102 is monitored by a shaft encoder 135 arranged proximal to the drive sprocket for the laminating rolls 104 and a signal provided on a line 308 to the control network 134. Suitable for use as the shaft encoder 135 is a device manufactured by Photocraft, Inc., Aurora, Ill., sold under model number RG200/5. When a predetermined portion of the board is through the wedges 102, gripping elements 136 which form a part of a gripping arrangement 130 grasp the laminate on opposite sides thereof. The gripping elements 136 are actuated by an actuator 137 controlled by the control network 134. Simultaneously an actuator 138, also part of the gripping arrangement 130, is activated by the control network 134 to apply a displacement force acting in the direction 140 (parallel to the arrow A) drawing the gripping elements 136 and the laminate grasped thereby away from the wedges 102. However, so long as the laminate is engaged between the wedges 102 the displacement force exerted by the actuator 138 is insufficient to overcome the restraining force imposed on the portion of the laminate within the apparatus to dislodge the laminate from the interior thereof. As discussed herein, once the trailing edge of the laminate clears the wedges 102 the force exerted by the actuator 138 becomes dominant and the laminate jerks in the direction 140 and the laminate is lead onto rollers 142. Upon the imposition of an impulse force the resist severs along a tear line substantially coextensive with the trailing edge of the laminate.

The carriage on which the gripping elements 136 are carried includes a magnet 144. A magnetic sensor switch 146 responds to the proximity of the magnet 144 thereto and provides a signal on a line 310 to the control network 134 that indicates that the gripping elements 136 have reached the end of travel. The magnet is sold by Microswitch Division of Honeywell Corp., Freeport, Ill. under number 101MG7 while the sensor switch 146 is sold by the same manufacturer under model number 413SR10. At the occurrence of the signal the gripping elements 136 release their grasp on the laminate and the actuator 138 is energized in an opposite direction returning the gripping elements 136 to their initial position to await the exit of the next successive laminate from the wedges 102. The laminates may now be manually or automatically stacked, or if desired, applied to other process steps.

With reference to FIGS. 4 through 7 detailed illustrations of the circuit board gripping arrangement 130 and its mode of interaction with the automatic laminating apparatus 10 (FIG. 1) are shown.

At the discharge end of the apparatus 10, just downstream from the nose of the wedges 102 a forward transverse plate 152F is mounted between blocks 154L and 154R disposed on the side plates 150R and 150L of the apparatus 10. Spaced rearwardly from the plate 152F is a second transverse plate 152R itself secured to the side plates of the apparatus 10. The rollers 142 (FIG. 1) are journalled in the side plates 150 of the apparatus 10 just in front of the second transverse plate 152R. Passing beneath the rollers 142 are guide rods 156 and 158. The guide rods 156 and 158 are threadedly connectable to the front plate 152F and securable by bolts 160 to the rear plate 152R.

The actuator 138 (FIG. 1) includes a pressure cylinder 166C having a piston 166P therein. Suitable for use as the actuator 138 is a double acting (driven in both direction) device sold by Clippard Corp., Cincinnati, Ohio, under trademark "Minimatic" and model number 18CSD-3. The cylinder 166C projects through an opening 168 formed in the rear plate 152R. Suitable pressure inlet and outlet fittings 169 and 170 are provided for the cylinder 166C. Flow control valves 169V and 170V are mounted proximal to the fittings 169 and 170, respectively, to control the speed at which the carriage displaces along the tie rods 156 and 158. Suitable for use as the valves 169V and 170V are devices sold by Imperial Eastman, 312-CP-90° or 310-CP-inline, with polyflow connector. The projecting portion of the cylinder 166C is secured with an annular retainer 171 by mounting bolts 172. The retainer is itself mounted to the rear plate 152 about the opening 168 therein by bolts 173. A piston rod 166R projects axially from the cylinder rod 166C. The free end of the piston rod 166R is provided with an upwardly extending tie rod 174 for the purpose discussed more fully herein.

A carriage 178 is mounted for reciprocating guided movement in the direction of arrows 140F and 140R with respect to the guide rods 156 and 158. The underside of the carriage is scooped, as at 180, to accommodate the actuator 138 therebeneath. One side of the carriage 178 is provided with a sidewise projecting yoke 182 onto which a pair of guide rollers 184U and 184L are secured by mounting nuts and washers 186. The rollers 184 engage the rod 156 along bearing surfaces extending lengthwise thereof as the carriage 178 is reciprocated therealong.

The opposite side of the carriage 178 is provided with a through bore 188. A slit 190 extends sidewise into the carriage 178, the slit 190 communicating with the bore 188 throughout its length. The bore 188 receives bearings 192F and 192R. Suitable for use as the bearings 192 are linear ball bearings sold by Thompson Bearing Co., Port Washington, N.Y. under model number ADJ-112026. The bearings 192 engage the tie bar 158 and provide low friction surfaces along which the reciprocating motion of the carriage 178 is effected. The lobes of the carriage defined by the slit 190 are clamped by clamp bolts 196F and 196R to hold the bearings 192 in place.

Mounted to the rear plate 152F are first and second guide members 200 each having an inclined guiding surface 202 thereon. The inclined guide surfaces 202 act to guide laminated circuit boards withdrawn from the apparatus 10 by the gripping arrangement 136 onto the surface of the rollers 142 as the laminates are withdrawn from the wedge 102 in the manner discussed herein.

The carriage 178 is bolted to a cross bar 206 which extends laterally from the carriage 178 by bolts 208 one of which shares the same tapped hole as the clamp bolt 196F.

In operation, the carriage 178 is reciprocally movable in the direction 140R by selective pressurization of the region 166F of the cylinder 166C in front of piston 166P. Conversely, pressurization of the region 166R behind the piston 166P has the effect of displacing the carriage 178 in the opposite direction 140F. In each instance the carriage 178 moves along the rolling surfaces defined between the rollers 184 and the rod 156 and along the bearing surfaces defined between the bearings 192 and the tie rod 158.

The magnet 144 is mounted to the carriage 178 and the magnetic sensor switch 146 (FIG. 1) is mounted to the rear plate 152R. The sensor switch 146 is adapted to generate a signal on the line 310 when the carriage reaches the end of its travel in the direction 140F. This signal is utilized in the manner discussed herein by the control network 134. In operation, care must be exercised to insure that the correct pole of the magnet 144 is projected toward the switch 146.

Mounted in a confronting relationship on each end of the laterally extending cross bar 206 is a gripping element 136R and 136L. Each of the gripping elements 136 is identical in construction. Each of the gripping elements 136 includes an inverted U-shaped base plate 224 having a channel 226 extending therethrough. The channel 226 is closed by a bottom plate 228 secured by bolts 230 extending into the depending arms of the baseplate 224. The cross bar 206 extends through the confined opening defined by the baseplate 224 and the bottom plate 228. The relative location of the gripping element 136 with respect to the cross bar 206 is secured by a friction plate 232 trapped in a recess 234 formed in the bottom plate 228. The friction plate 232 is urged into a friction generating interface with the undersurface of the cross bar 206 by a thumb wheel 236.

The upper surface of the base plate 224 is provided with a grasping insert 238. The insert 238 is secured in a recess 239 formed in the baseplate 224 by bolts 240. Also disposed in the upper surface of the baseplate 224 is a socket 242 for a purpose made clearer herein.

A lever housing 244 in the form of an inverted U-shaped member is connected to the upper surfaces of the base plate 224 by bolts (not shown) which extend through the legs of the housing 244 into the baseplate 224. The housing 244 has an access aperture 246 therein for a purpose hereinafter discussed. A portion of the housing 244 is cut away, as at 248, also for a purpose discussed herein.

The lever housing has outwardly projecting tabs 250 therein. The central portion of the tabs 250 are themselves extended to define integral arm members 252. The tabs 250 receive an upper cross piece 254 which is secured to the tabs 252 by bolts 256. A lower cross piece 258 is spaced a predetermined distance below the upper cross piece 254 and is secured to the tabs 252 by bolts 260. The cross pieces 254 and 258 cooperate with the lever housing 244 and the tabs 252 thereof to define a vertically extending channel which registers with the insert 238 mounted to the baseplate 224.

A grasping element 268 is movably disposed with respect to the lever housing 244 within the vertical channel. The grasping element 268 and the insert 238 are each fabricated of nylon, although any suitable material which will grasp the laminate without scratching may be used. The grasping element 268 has a central cut-out portion, or window 270 defined therein. A lever 272 extends through the cut-out 270 in the grasping element 268. The lever 272 carries an axle 274 on which an array of rollers 276 are disposed. The rollers 276 act to equalize the imposition of forces on the grasping element 268 in a manner hereafter discussed.

One end of the lever 272 extends outwardly from the housing 246 and is pivotally connected to the arms 252 by a fulcrum pin 278. The lever 272 extends through the interior region of the lever housing 244 into vertical alignment with the access aperture 246. The inner end of the lever 272 is pivotally connected, as at 280 to the lower end of a piston rod 282R extending through the aperture 246 from a pressurized actuating cylinder 282C which forms part of the actuator 137. Suitable for use as the actuator 137 is a spring-loaded return device sold by Clippard Corp., Cincinnati, Ohio, under model number 9SS-3/4. The cylinder 282C is suitably secured to the upper surface of the lever housing 244. The lever 272 has a socket 284 disposed in a confronting relationship with the socket 242 provided in the upper surface of the base plate 224. The sockets 242 and 284 each receive and capture one end of a bias spring 286.

In operation, with the lateral edge of a circuit board CB received within the cutaway portion 248 of housing 244, a downwardly directed force acting in the direction of the arrow 288D is transmitted through the lever arm 272 to the movable grasping element 268. The movable grasping element 268 responds to the force imposed thereon by moving in a grasping direction 290D toward the grasping insert 238, thus compressing the spring 286. The array of rollers 276 tend to equalize the imposition of the closing force on the grasping element 268, thus preventing point contact between the grasping element 268 and the circuit board CB. The board CB is thus securely grasped between the grasping element 268 and the insert 238. When the pressure force in the direction 288D is released, the spring 286 urges the lever arm 272 in the direction of arrow 292, thus displacing movable grasping element 268 in the opposed direction 290U away from the circuit board CB. A roller 287 provides a rolling surface to prevent the laminate from being dragged back with the gripping element 220 once the laminate is released.

It may be appreciated in view of the foregoing that if the grasping motion just discussed is coordinated with the rectilinear motion of the carriage 178 (to which the gripping elements 220 are interconnected) a circuit board CB grasped at its edge (or edges) by one (or two) gripping elements 136 may be rectilinearly conveyed away from the wedge 102 toward the rollers 141 in the direction of the arrow A.

The control network 134 is adapted to initiate and control the sequence of operations of the gripping arrangement including the reciprocation of the carriage 178 and the gripping by the gripping elements 136, thereby to effect the grasping, removal and severance of a laminate from the resist material.

The control network 134 is arranged to receive output signals over a line 302 from the sensor 132. The sensor 132, which includes a phototransmitter 132T and a photoreceiver 132R provides a signal representative of the emergence of a laminate from the nose of the wedges 102.

A shaft encoder 135 is arranged to generate a signal to the control network 134 over a line 308 representative of the speed at which the laminate is emerging from the apparatus 10. This signal may be conveniently derived from any suitable location. In the location (the drive sprocket of the laminating rolls) selected, the signal applied to the control network 134 is a pulse train the frequency of which is functionally related to the speed of the laminate through the wedges 102.

The control network 134 includes a frequency-to-voltage converter 316 which receives the input pulse train applied over the line 308. Suitable for use as the converter 316 is a device sold by Motorola under model number LM2917 N-8. The converter 316 converts that pulse train signal on the line 308 to a voltage signal. The voltage signal is applied, after appropriate phase inversion by a phase inverter 318, through a variable resistor 320 to an integrating network 322. The integrating capacitor 324 in the network 322 is normally short-circuited through an integrated circuit shunt switch 326. Suitable for use as the integrated circuit shunt switch is a device sold by Motorola under model number CD 4016 A.E. However, upon receipt of the signal on the line 302 by a latch network 328 the switch 326 is opened, thus permitting integration of the voltage signal applied to the integrator 322 to occur. Suitable for use as the latch 328 is a device sold by Texas Instruments under model number TL084. The output of the integrating network 322 therefore carries on a line 330 a voltage signal representative of the integral of the laminate's speed over time, that is, the distance that the laminate has emerged from the wedges 102.

The output of the integrating network 322 is applied to the inverting input of a comparator 332. The noninverting input of the comparator 332 is derived from an amplifier 334 on a line 336. The noninverting input to the amplifier 334 is derived from an operator controlled thumbwheel switch (not shown). The inverting input to the amplifier 334 is derived from a potentiometer 338. The output signal from the amplifier 334 represents the predetermined distance (less than the board length as set from the thumbwheel) that the laminate has emerged from the wedges 102 at which it is desired to grasp the laminate by the gripping arrangement 130.

When the laminate has emerged from the wedges 102 a distance equal to the predetermined distance the output of the comparator 332 is true. A signal is applied on a line 340 to set a bistable multivibrator 342. The Q output signal from the multivibrator 342 is applied over a line 344 to a transistor 346. Suitable for use as the multivibrator 342 is a device sold by Texas Instruments under model number TL084. The change in state of the signal at the collector of the transistor 346 is applied by a line 348 to a solid state switch (not shown) which then permits an energizing current to flow through solenoid controlled valves regulating the admission of pressurized fluids to the actuator 137 (for the gripping elements 136) and to the actuator 138 (for the carriage 178). Suitable for use as the solenoid control valve for the actuator 137 is a device sold by Versa Products Company, Englewood, N.J. under model number ESM-3201-44. The solenoid control valve for the actuator 138 is sold by the same manufacturer under model number ASG-4232-31-70. The solid state switch when gated by the control signal at the collector of the transistor 346 applies a 120 V.A.C. line signal to the valves to apply pressurized actuating fluid to the actuators 137 and 138 to respectively grasp the laminate and initiate the imposition of a displacing force on the carriage 178. Suitable for use as the solid state switch is a device sold by Motorola under model number M-120-DO-2A.

The transistor 346 thus controls the application of pressurized fluid to the actuator 138, to thus grasp the laminate by the grasping element 268 and to simultaneously pressurize the cylinder 166C to withdraw the carriage 178 in the direction 140F. The displacement force of the actuator 138 in the direction 140F does not immediately become dominant. Only when the laminate has cleared the wedges 102 is the force of the actuator 138 imposed as an impulse to the laminate, thus severing the laminate from the resist material.

When the trailing edge of the laminate clears the wedges 102, the state of the output signal from the photodetector in the sensor arrangement 132 changes. This results in the shunt switch 326 being closed under the control of the latch 328, thus discharging the integrating capacitor 324.

When the carriage 178 has reached its full travel in the direction 140F, the switch 146 transmits a signal to the control network 134 over the line 310. The signal from the switch 146 is applied on a line 350 to reset the multivibrator 342. This again changes the state of the signal at the collector of the transistor 346. The actuator 137 for the gripping element is deactivated and the actuator 138 is reversed, thus returning the carriage to the first position to await next-successive laminate.

As a precaution, the change in the state of the output of the multivibrator 342 is also applied over a line 354 to the latch 328 to also temporarily close the shunt switch 326 in the event the sensor arrangement fails to detect the gap between successive laminates.

Figure 8:
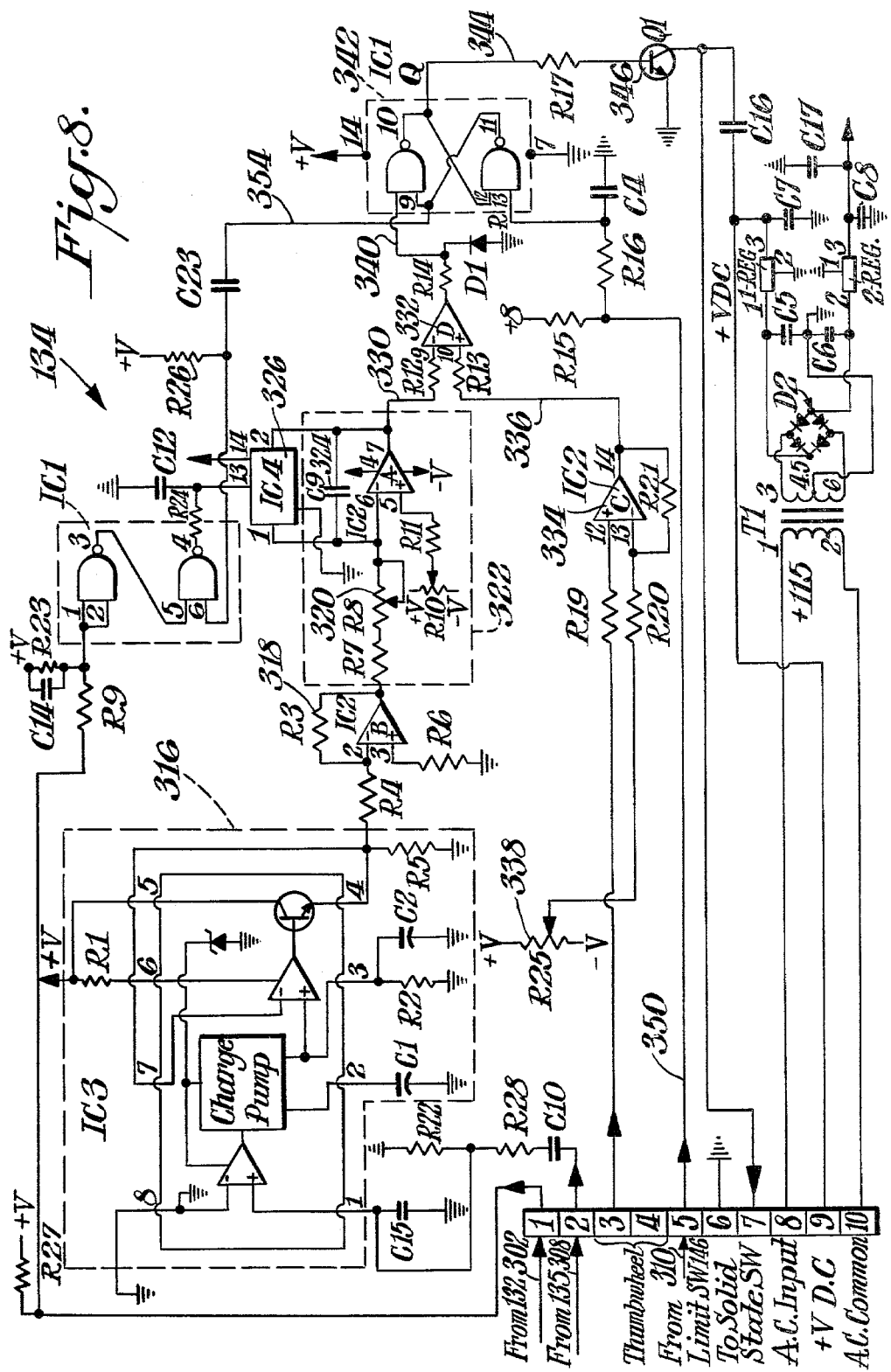
FIG. 8 is a schematic diagram of an electrical control network in accordance with the instant invention.

The components C1, C9, R7 and R8 are selected for their stability to provide repeatable accurate gripping of the laminate. The component values for the circuit elements shown in FIG. 8 are as follows:

| | |
|---|---|
| C5, C6 | 560 microfarad, .15V |
| C16, C17 | 50 microfarad, 25V |
| | Cornel-Dublier, |

-continued

| | |
|---|---|
| C9 | WBR (electrolytic) 3.3 microfarad Cornel-Dublier, WMF-05 W4 |
| C13, C14 | 1.0 microfarad |
| C2 | .56 microfarad |
| C7, C*, C10, C15 | .22 microfarad |
| C3, C12 | .10 microfarad |
| C1 | .01 microfarad, Cornel-Dublier, MMW-4S1 |
| C4 | .01 microfarad |
| R2, R26 | 1M ohm |
| R7 | 1M ohm, Dale Electronics Inc. RN60D |
| R8 | 500K ohm (ceramic trimming potentiometer) |
| R4, R5, R6, R11, R16, R19, R20, R21, R23 R24, R28, | 100K ohm |
| R3 | 47K ohm |
| R9, R12, R13, R14, R15, R17, R22 | 10K ohm |
| R10, R25, R27 | 1K ohm |
| R1 | 470 ohm |
| T1 | Signal PC-20-220 |
| D1 | 1N457 |
| D2 | Motorola M920 A-6 |
| Q1 | 2N1613 |
| IC1 | RCA, CD4011, A.E. |
| IC2, A,B,C,D | Texas Instruments; TL084 |
| IC3 | Motorola LM2917, N-8 |
| IC4 | Motorola CD 4016, A.E. |
| Reg-1 | Texas Instruments MA 7808 CKC |
| Reg-2 | Texas Instruments MA 7908 CKC |

Those skilled in the art, having benefit of the teachings hereinabove set forth, may effect numerous modifications to the instant invention. However, it is to be understood that such modifications are to be construed as lying within the scope of the present invention, as defined in the appended claims.

We claim:

1. In an apparatus for applying a resist material to a planar member to form a laminate as the member is advanced therethrough, the laminate being subjected to a restraining force within the apparatus, a gripping arrangement for removing the laminate from the apparatus comprising:

a carriage movable under the influence of a predetermined displacement force from a first to a second position;

a first actuator for applying a predetermined displacement force on the carriage;

a gripping element mounted to the carriage, the gripping element being movable from an open to a grasping position;

a second actuator for moving the gripping element from the open to the grasping position;

a detector for generating a signal representative of the emergence of the laminate from the apparatus; and, means responsive to the signal for simultaneously energizing the actuators to move the gripping element to the grasping position and initiating the application of the displacement force to the carriage, the magnitude of the displacement force being such that it is dominated by the restraining force until the laminate is advanced completely through the apparatus, the displacement force thereupon becoming dominant to apply a jerking force to free the laminate from the resist material and displace the carriage to the second position.

2. The gripping arrangement of claim 1 wherein the gripping element comprises:

a housing;

a grasping member movable in the housing from the open to the grasping position, the grasping element having an opening therein; and a lever connected to the second actuator, the lever having an array of rollers thereon, the rollers being displaced within the opening such that the force imposed by the second actuator on the lever is equally applied to the grasping member to prevent point contact between the grasping member and the laminate.

* * * * *